(12) United States Patent
Zhang et al.

(10) Patent No.: US 8,595,538 B2
(45) Date of Patent: Nov. 26, 2013

(54) SINGLE-CLOCK-BASED MULTIPLE-CLOCK FREQUENCY GENERATOR

(75) Inventors: Yifeng Zhang, San Jose, CA (US); Peiqi Xuan, Saratoga, CA (US); Kanyu Cao, Cupertino, CA (US); Xiaodong Jin, Saratoga, CA (US)

(73) Assignee: Quintic Holdings, George Town, Grand Cayman (KY)

( * ) Notice: Subject to any disclaimer, the term of this patent is extended or adjusted under 35 U.S.C. 154(b) by 1013 days.

(21) Appl. No.: 12/041,543

(22) Filed: Mar. 3, 2008

(65) Prior Publication Data

US 2009/0243690 A1 Oct. 1, 2009

(51) Int. Cl.
*G06F 1/00* (2006.01)
*G06F 1/04* (2006.01)
*H03L 7/06* (2006.01)

(52) U.S. Cl.
USPC ............ 713/500; 713/501; 375/376; 327/147

(58) Field of Classification Search
USPC .................. 713/500, 501; 375/376; 327/147
See application file for complete search history.

(56) References Cited

U.S. PATENT DOCUMENTS

| | | | | |
|---|---|---|---|---|
| 4,275,457 A | * | 6/1981 | Leighou et al. | 713/500 |
| 5,133,064 A | * | 7/1992 | Hotta et al. | 713/375 |
| 5,663,687 A | * | 9/1997 | Kozu | 331/14 |
| 6,366,522 B1 | * | 4/2002 | May et al. | 365/227 |
| 6,441,667 B1 | * | 8/2002 | Boerstler et al. | 327/295 |
| 6,687,320 B1 | * | 2/2004 | Chiu et al. | 375/376 |
| 6,889,331 B2 | * | 5/2005 | Soerensen et al. | 713/320 |
| 7,590,153 B2 | * | 9/2009 | Solheim et al. | 370/538 |
| 7,683,894 B2 | * | 3/2010 | Kent | 345/177 |
| 2004/0178855 A1 | * | 9/2004 | Gharpurey et al. | 331/14 |
| 2008/0164927 A1 | * | 7/2008 | Wang | 327/254 |
| 2008/0288804 A1 | * | 11/2008 | Gorti et al. | 713/400 |
| 2009/0051394 A1 | * | 2/2009 | Reynolds et al. | 327/119 |

FOREIGN PATENT DOCUMENTS

| | | | | |
|---|---|---|---|---|
| JP | 2000022507 A | * | 1/2000 | |
| JP | 2005176368 A | * | 6/2005 | |

OTHER PUBLICATIONS van Roon, Phase-Locked Loops, Nov. 17, 2010, http://www.sentex.ca/~mec1995/gadgets/pll/pll.html.*

(Continued)

*Primary Examiner* — Mark Connolly
(74) *Attorney, Agent, or Firm* — Maryam Imam; IPxLaw Group LLP

(57) ABSTRACT

In an embodiment of the present invention, a clock generator circuit is disclosed to include a phase locked loop (PLL) that is responsive to a reference frequency and operative to generate a single clock frequency and a clock signal quadrature output frequency and a clock signal in-phase output with the frequency of the clock signal quadrature output frequency and the clock signal in-phase output frequency being a fraction of the frequency of the single clock frequency. The PLL includes a single voltage controlled oscillator (VCO) that generates the single clock frequency. A plurality of dividers is included in the clock generator circuit and is responsive to the clock signal quadrature output frequency and the clock signal in-phase output frequency and generates multiple clock frequencies, each clock frequency being a unique frequency, each of the plurality of dividers generating an output, the final output of the plurality of dividers being synchronized to the reference frequency.

16 Claims, 2 Drawing Sheets

(56) References Cited

OTHER PUBLICATIONS

Roovers, Raf et al., "An Interference-Robust Receiver for Ultra-Wideband Radio in SiGe BiCMOS Technology," IEEE Journal of Solid-State Circuits, vol. 40, No. 12, Dec. 2005.

Razavi, Behzad et al., "A UWB CMOS Transceiver," IEEE Journal of Solid-State Circuits, vol. 40, No. 12, Dec. 2005.

Standard ECMA-368, 1st Edition—Dec. 2005, "High Rate Ultra Wideband PHY and MAC Standard," ECMA International.

* cited by examiner

SINGLE-CLOCK-BASED MULTIPLE-CLOCK FREQUENCY GENERATOR

BACKGROUND OF THE INVENTION

1. Technical Field of the Invention

The present invention relates generally to a high speed digital clock circuit that produces multiple clock frequencies, and particularly to a wireless communication system using the clock circuit, one such system being the Multi-Band Orthogonal Frequency Digital Modulation (OFDM) Alliance (MBOA) Ultra Wideband (UWB) system.

2. Description of the Prior Art

Digital clock generation is used in digital electronic systems to maintain synchronism of processes. In the MBOA UWB system, several radio frequency (RF) clock frequencies subject to severe timing restraints are needed in the transceiver circuitry. Clock generators are typically used to generate one or more clocks employed by various circuits in the system. A voltage-controlled oscillator (VCO) is typically used to generate a clock signal. Some constraints of VCOs include tuning range and potential interference in frequency bands of interest due to harmonic spurs. Improved design of a clock generation scheme can achieve an optimized system in terms of power consumption, tuning range, form factor and manufacturing cost.

Existing digital clock generators have used a three voltage controlled oscillator design to provide the three required clock frequencies. Such a design is straightforward, but it suffers from high power consumption and has a large form factor. Form factor refers to the size, configuration, or physical arrangement of the circuit. A larger form factor generally relates to high manufacturing costs.

Another prior art digital clock generator uses two voltage controlled oscillators combined with a mixer. Although not as straightforward as using voltage controlled oscillators to generate the needed three clock frequencies, this design requires only two voltage controlled oscillators. However, two voltage controlled oscillators still consume significant power, while resulting in a large form factor and high manufacturing costs.

What is needed is a clock frequency generator with reduced power consumption and form factor, as well as lower manufacturing costs.

SUMMARY OF THE INVENTION

Briefly, in an embodiment of the present invention, a clock generator circuit is disclosed to include a phase locked loop (PLL) that is responsive to a reference frequency and operative to generate a single clock frequency and a clock signal quadrature output frequency and a clock signal in-phase output with the frequency of the clock signal quadrature output frequency and the clock signal in-phase output frequency being a fraction of the frequency of the single clock frequency The PLL includes a single voltage controlled oscillator (VCO) that generates the single clock frequency. A plurality of dividers is included in the clock generator circuit and is responsive to the clock signal quadrature output frequency and the clock signal in-phase output frequency and generates multiple clock frequencies, each clock frequency being a unique frequency, each of the plurality of dividers generating an output, the final output of the plurality of dividers being synchronized to the reference frequency.

The foregoing and other objects, features and advantages of the present invention will be apparent from the following detailed description of the preferred embodiments which make reference to several figures of the drawing.

DETAILED DESCRIPTION OF THE INVENTION

To overcome the limitations in the prior art described above, and to overcome other limitations that will become apparent upon reading and understanding the present specification, the present invention discloses clock generation circuits which generate multiple clock frequencies using a single voltage controlled oscillator (VCO). By using only a single VCO a smaller form factors and thereby lower manufacturing cost is achieved. By sharing the first divider of a divider circuit between clock generation and a phase locked loop (PLL), lower power consumption can also be achieved. Such a design can be used in electronic systems that use multiple clock frequencies, more particularly applicable to a wireless communication system. For example, in Multi-Band OFDM Alliance (MBOA) Ultra Wideband (UWB) system, each band group needs three clock frequencies. By using one VCO to generate all three frequencies, the required additional cock generation circuits currently used in the prior art can be eliminated. The reduction in required clock generation source circuits in the present invention reduces both power consumption and manufacturing cost when compared existing digital clock generators. The present invention also enables faster frequency hopping in a time frequency interleaving (TFI) mode, where less than 9 ns is allowed for switching between two clock frequencies.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of embodiments of the present invention.

Figure 1:
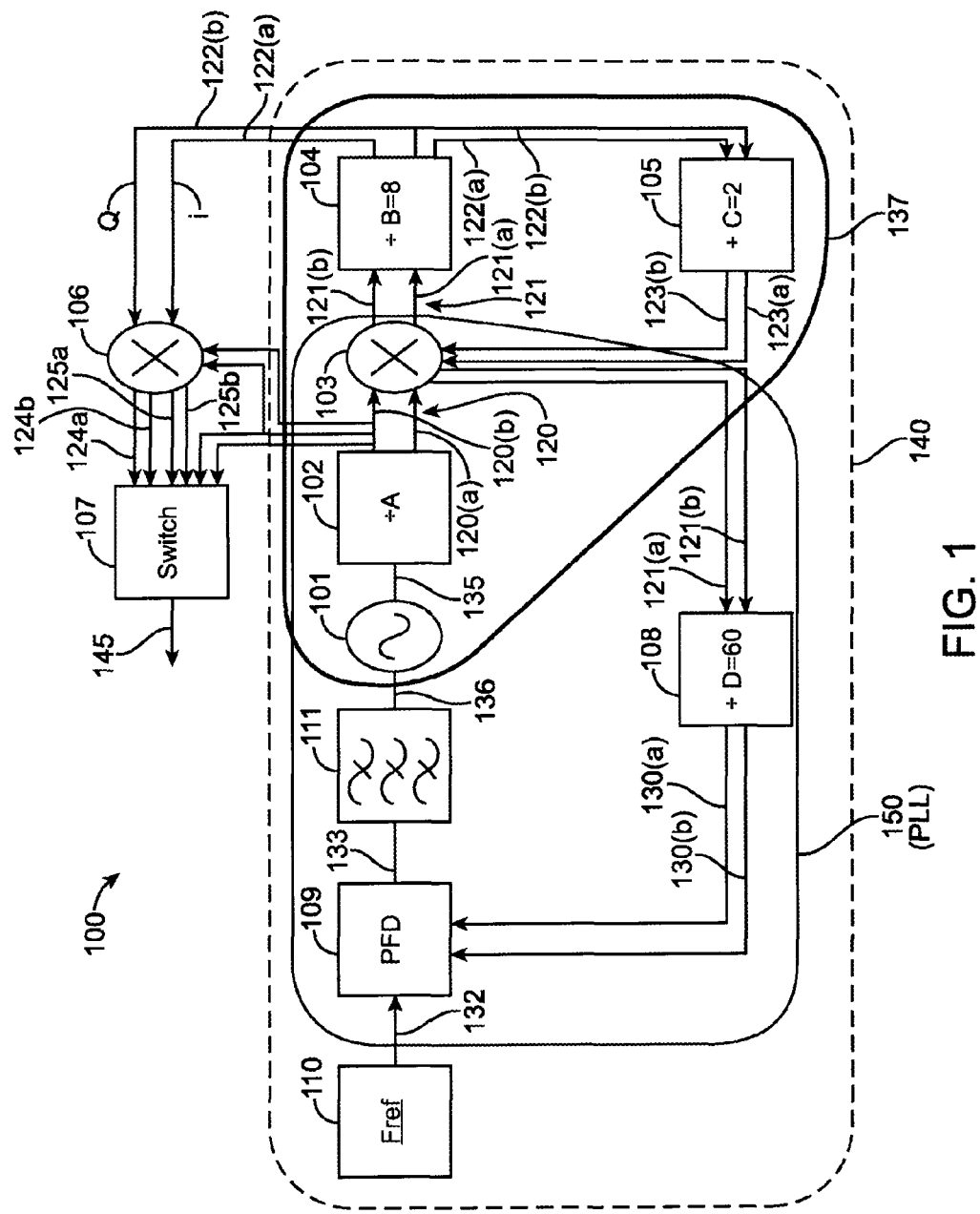
FIG. 1 shows a block diagram of a first clock generation circuit according to the invention.

FIG. 1 shows a block diagram of a clock generation circuit 100, in accordance with an embodiment of the present invention. The circuit 100 is shown to include a voltage controlled oscillator (VCO) 101, a first divider 102, a first single sideband (SSB) mixer 103, second divider 104, third divider 105, second single sideband (SSB) mixer 106, frequency selection switch 107, fourth divider 108, phase frequency detector (PFD) 109, reference frequency generator 110, and low-pass filter 111.

The dividers 102, 104, 105 and 108 serve as fractional frequencies by dividing the frequency of their input by a predetermined value. For example, the divider 102 divides by the integer value 2 which results in the frequency of its input being divided by two. The dividers 104 and 105 collectively divide frequency by 7.

VCO 101 is shown to receive the filtered phase synchronized error signal 136 from low-pass filter 111 and is operative to generate single clock frequency f0 135. The low-pass filter 111 is shown to receive a synchronized signal 133, which is generated by the phase frequency detector (PFD) 109. The PFD 109 is shown to receive a reference frequency 132 from the reference frequency generator 110. The reference frequency generator 110 generates the reference frequency 132.

First divider 102 is shown to receive frequency 135 and is operative to divide the frequency 135 by approximately half (or two) to yield an in-phase and a quadrature output, which are 90 degrees phase-offset to one another. Quadrature output, as used herein, describes the output of a frequency divider 102, 104, 105, or 108 in the form of both a carrier wave and a 'quadrature' carrier wave that is 90° out of phase with the main carrier. Because the clock generator circuit 100 advantageously uses only a single voltage controlled oscillator (VCO), the resulting output frequencies of dividers 102, 104, 105, and 108 do not require further synchronization following each division. This advantageously reduces form factor and decreases power consumption and manufacturing costs. Prior art designs using multiple VCOs require further synchronization of their VCO outputs.

First divider 102 is operative to generate clock signal output frequency 120. Clock signal output frequency 120 is further comprised of clock signal quadrature output frequency 120($a$), and clock signal in-phase output frequency 120($b$). Both frequency 120($a$) and frequency 120($b$) are received by frequency selection switch 107, and first single sideband (SSB) mixer 103.

First single sideband (SSB) mixer 103 is shown to receive clock signal output frequency 120, consisting of frequency 120($a$), and 120($b$), and is operative to generate phase and frequency synchronized clock frequency f1 121. Phase and frequency synchronized clock frequency f1 121 is shown to be comprised of a quadrature phase frequency 121$a$ and an in-phase frequency 120($b$). Mixer 103 additionally receives output 123 from third divider 105, which is used in generating frequency 121. Output 123 is shown to be comprised of a quadrature output 123($a$) and an in-phase output 123($b$). Second divider 104 is shown to receive frequency 121, comprising frequency 121($a$) and frequency 121($b$), and is operative to generate output 122. Output 122 is shown to be further comprised of quadrature output 122($a$), and in-phase output 122$b$. Third divider 105 is shown to receive output 122, comprised of output 122$a$ and 122($b$), and is operative to generate output 123. Output 123 is shown to be further comprised of quadrature output 123($a$) and in-phase output 123($b$). Output 123 is received by mixer 103. In total, mixer 103 receives two separate and unique inputs, output 123 and output.

Feedback clock-frequency generator 137 is shown to be comprised of a voltage controlled oscillator (VCO) 101, a first divider 102, a first single sideband (SSB) mixer 103, second divider 104, and a third divider 105. During operation of either the embodiment 100 of FIG. 1 or alternative embodiment 100A shown in FIG. 2, the clock frequency f0 135 of the VCO 101 is first divided by ratio A, A being an integer value, and the divider 102 generates a frequency f0/A 120. In an exemplary embodiment, A is substantially two. The frequency f0/A 120 comprises a quadrature output 120$a$ and a in-phase output 120$b$, which both serve as input to the first single sideband (SSB) mixer 103.

In an exemplary embodiment of the present invention, second divider 104 divides by 8. Among resulting outputs of divider 104 are the outputs of dividing the frequency by 5. Effectively, the output of divider 104 includes the resulting output of dividing by integers 5, 7, and 9. Through dividing by 8 with divider 104 the circuit 100 generates an output which can later be divided by two at divider 105. The resulting output of divider 105 and divider 104 advantageously allows a single VCO to generate the three required clock frequencies. Furthermore, frequency is divided by an odd value, which is not done by prior art methods.

Described in the context of the specific frequency requirements of Multi-Band OFDM Alliance (MBOA) Ultra Wideband (UWB) system, VCO 101 generates a substantially 3,960 MHz source frequency, the first single sideband mixer 103 generates a frequency offset of substantially +/−528 MHz, and the second divider 104 divides by 8 and third divider 105 divides by two to yield hopping frequencies of substantially 3,432 MHz, 3,960 MHZ and 4,488 MHz for Band-Group One compliant with the aforementioned system.

In an example where a division by 7 of the frequency is desired at the output of the divider 104, this is done by the following equations:

$$fi + fx/8 = fx \qquad \text{Eq. (1)}$$

$$fi = fx*7/8 \qquad \text{Eq. (2)}$$

$$fx = fi/7*8 \qquad \text{Eq. (3)}$$

where fx is the desired frequency, Eq. (1) is the output of the divider 104 and Eqs. (2) and (3) describe the operation of the divider 105 and the respective output frequency. Thus, the frequency of the phase and frequency synchronized clock frequency f1 121 is effectively divided by 7, which is an odd number.

The mixer 103 further receives as input a clock 123 whose frequency is equal to the output frequency of mixer 103 divided by the product of B times C, which in the preferred embodiment is 8 times 2 or 16. The quadrature output 120$a$ and in-phase output 120$b$ is shown to be coupled to the frequency selection switch 107 and to the mixer 106.

The mixer 103 is a single sideband mixer that combines (or multiplies) the in-phase components and also separately multiplies the quadrature components. In an alternative embodiment, the mixer 103 is a double quadrature sideband mixer that multiplies the in-phase components together and the quadrature components together and then also multiplies the in-phase and the quadrature components. It should be noted however, that the double quadrature sideband mixer consumes more power and is larger in size but offers a more accurate output than the single sideband mixer.

The circuit 100 operates at the frequency bands (or ranges) specified by the UWB standard.

The VCO 101, the first divider 102, the first single sideband (SSB) mixer 103, second divider 104, third divider 105 collectively form a feedback clock-frequency generator 137 that generates a phase and frequency synchronized clock frequency f1 121 as the output of mixer 103. In an exemplary embodiment, the clock frequency f1 121 is represented by the following equations:

$$f1 = f0/[(1+1/BC)A], \text{ or} \qquad \text{Eq. (4)}$$

$$f1 = f0/[(1-1/BC)A] \qquad \text{Eq. (5)}$$

In an exemplary embodiment, A refers to 2, B refers to 8, and C refers to 2. The value of f1 can be selected by properly choosing the SSB mixer output. Frequency f1/B is fed into a SSB mixer 106 and mixed with f1 to generate the desired frequencies f1+f1/B and f1−f1/B. The clock frequency f1/(BC) is also fed into the fourth divider 108 to generate a final output frequency that is equal to the reference frequency 132 when the loop is stable. Stable, as used herein, is defined as non-linearity experienced by a circuit. The divide ratio of divider 108 thus needs to be programmed dynamically or statically to suit this purpose. Divider 108 does not affect loop stability. To this end, the PFD 109 is a loop filter, or a special low pass filter that guards against instability by employing resistors and capacitors of values that prevent such stability. Loop filters are known to those skilled in the art.

Referring still to FIG. 1, phase locked loop (PLL) 150 is shown to include voltage controlled oscillator (VCO) 101, a first divider 102, a first single sideband (SSB) mixer 103, fourth divider 108, phase frequency detector (PFD) 109, and low-pass filter 111. PLL 150 compensates for undesirable phase offsets in the signal being generated by adjusting for any offsets in the quadrature output 120a and in-phase output 120b. Because the received input is already synchronized before entering VCO 101, further downstream synchronization of output 122, output 123, clock signal output frequency 124, and clock signal output frequency 125 is unnecessary.

In an exemplary embodiment, the circuit 100 is designed to conform to the standards of the Multi-Band Orthogonal Frequency-Division Multiplexing (OFDM) Alliance (MBOA) Ultra Wideband (UWB) system. It is understood however that the circuit 100 may operate at other frequencies. Accordingly, VCO 101 is operative to generate single clock frequency f0 135. Frequency 135 is operative at a frequency of substantially 7920 MHz so as to conform to the foregoing standard. Frequency 135 is received by first divider 102. Divider 102 is operative to generate clock signal output frequency 120 at a frequency of substantially 3960 MHz. Frequency 120 is shown to be received by first single sideband (SSB) mixer 103. Mixer 103 is operative to generate the phase and frequency synchronized clock frequency f1 121 at a frequency of substantially 4224 MHz. Frequency 121 is shown to be received by second divider 104. Divider 104 is operative to generate output 122 at a frequency of substantially 528 MHz. The third divider 105 is shown to receive output 122, and is operative to generate output 123 at a frequency of substantially 264 MHz.

Said exemplary embodiment of circuit 100 is further shown to include a fourth divider 108. Divider 108 receives phase and frequency synchronized clock frequency f1 121 from mixer 103. Divider 108 is operative to generate final output 130 at a frequency of substantially 66 MHz. Reference frequency generator 110 is shown to generate reference frequency 132 at a frequency of substantially 66 MHz. It is understood however that clock signal output frequency 120, phase and frequency synchronized clock frequency f1 121, output 122, output 123, final output 130, and reference frequency 132 may operate at other frequencies.

Also, in the exemplary embodiment of the above Eqs. (1) and (2), A refers to 2, B refers to 8, and C refers to 2. However in other embodiments, A, B, and C may equal other numbers.

The phase frequency detector (PFD) 109 is operative to compare the phase and frequency difference of outputs the fourth divider 108 and reference frequency generator 110 and to output the synchronized signal 133 used as an error signal. A low-pass filter 111 is used to filter out high frequency components. The filtered phase synchronized error signal is then used to control the frequency of VCO 101.

Referring still to FIG. 1, a second single sideband (SSB) mixer 106 is shown to receive output 122 from divider 104, and quadrature output 120 from divider 102. Mixer 106 is operative to generate two different output frequencies for clock purposes, clock signal output frequency 124a and 124b and clock signal output frequency 125a and 125b. Clock signal output frequency 124a and b is a quadrature output 124(a) and an in-phase output 124(b). Clock signal output frequency 125a and b is shown to be quadrature 124(a) and in-phase 124(b). Frequency selection switch 107 is shown to receive for selection clock signal output frequency 120, clock signal output frequency 124a and b, and clock signal output frequency 125a and b, where these three clock signal output frequencies are the three desired clock signals. Frequency selection switch 107 selects the selected clock frequency 145 from among the three supplied clock signal output frequencies 120, 124a and b, and 125a and b. Since the switch circuitry has a rapid response time, the switching time from one clock frequency to another is advantageously expedited.

Voltage controlled oscillator (VCO) 101, first divider 102, first single sideband (SSB) mixer 103, second divider 104, third divider 105, fourth divider 108, phase frequency detector (PFD) 109, reference frequency generator 110, and low-pass filter 111 form the control loop 140 which generates a stable VCO frequency. Phase and frequency synchronized clock frequency f1 121 (output of mixer 103) is shown to be received by fourth divider 108. Divider 108 is operative to generate final output 130.

The phase frequency detector (PFD) 109 is shown to receive final output 130. PFD 109 also receives reference frequency 132. Reference frequency 132 is shown to be generated by reference frequency generator 110. PFD 109 is operative to generate synchronized signal 133. In the final step of control loop 140, synchronized signal 133 is shown to be received by low-pass filter 111. Filter 111 is operative to generate a filtered phase synchronized error signal 136.

The divide ratios of 102, 104, 105 and 108 can be programmable or a fixed value, although the stated frequencies herein are desirable for the UWB application contemplated herein. The input signals of the SSB mixers 103, 106 are desirable to be quadrature signals (as illustrated by double lines) to maintain phase and frequency relationship. In addition, the second SSB mixer 106 desirably also has two outputs, each with an image frequency suppressed output due to the properties of a single sideband circuit.

Figure 2:
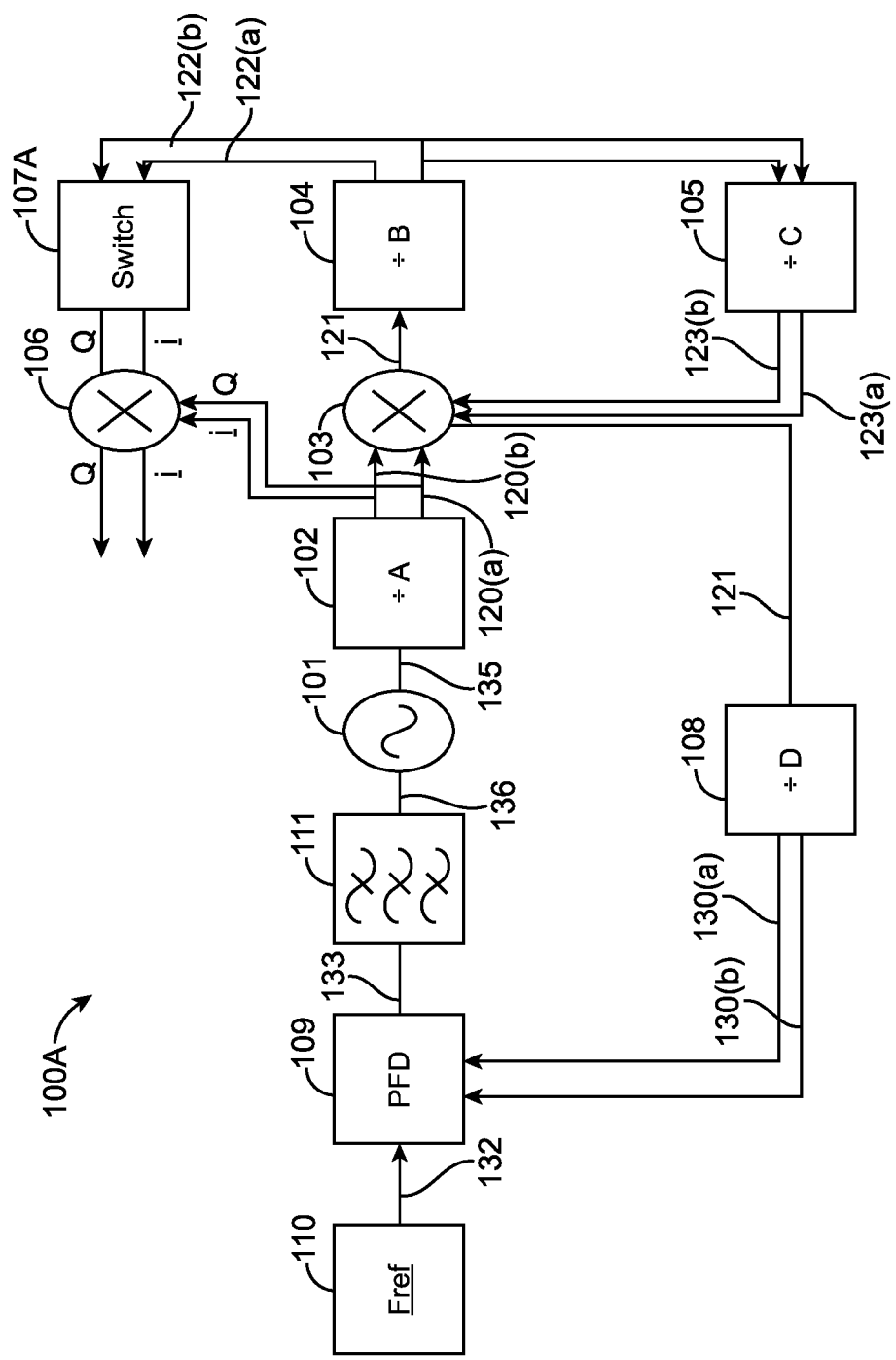
FIG. 2 shows a block diagram of a second clock generation circuit according to the invention.

FIG. 2 shows an alternative embodiment of the present invention in which frequency selection switch 107A is placed between single sideband (SSB) mixer 106 and second divider 104 to select either quadrature output 122a or in-phase output 122b from the second divider 104 into mixer 106, thereby producing a choice of pairs of different mixed output signals of frequencies that are in-phase and in quadrature-phase with one another based on the selected mixing signal into mixer 106. Circuit 100A of FIG. 2 advantageously places mixer 106 after frequency selection switch 107A, thereby reducing the switch circuit to include only one switch selecting between two inputs as opposed to the switch 107 of FIG. 1 includes two switches to switch between three inputs. Switch 107A is operative to switch the sign of quadrature output 122a or in-phase output 122b from the second divider 104 as well as a DC signal. As a result, circuit 100A of FIG. 2 has a smaller form factor, and is therefore comparatively less expensive to manufacture and consumes less power than circuit 100 in FIG. 1. The internal operation of the circuit 100 in FIG. 2 is otherwise like the operation of the circuit 100A of FIG. 1.

The above disclosed description of clock generation circuit 100 is a dual loop system which includes two interactive loops: one for generating a stable VCO frequency, the other for generating the desired multiple clock frequency output. Since the difference of loop time constant is large in prior art designs using two or more voltage controlled oscillators, the dual loop in the present invention shows increased stability. The frequency selection switch 107 (or 107A) selects one frequency from three output frequencies, f1, (f1+f1/B) and (f1−f1/B). Since the switch circuitry has a response time that is faster than that experienced by prior art systems, the switching time from one clock frequency to the other is advantageously expedited.

Properly choosing the divide ratios A, B, C and D and the VCO frequency can generate different output frequencies with specific utility. For example, in Band-Group One of the MBOA UWB system, VCO frequency f0 can be chosen as substantially 7,920 MHz, A is chosen as 2, thus, the input frequency of mixer 103 after being divided by 2 is substantially 3,960 MHz; if B equals to 8 and C equals to 2, then, the mixer output frequency can be substantially 4,224 MHz. Choosing the reference frequency equal to substantially 66 MHz, D will be 4. Or choosing the reference frequency equal to substantially 44 MHz, D will be 6. Thus the single frequency clock source has a circuitry portion, second divider 104, in common to generate hopping frequencies for an MBOA UWB system.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A clock generator circuit comprising:
    a phase locked loop (PLL) responsive to a reference frequency and operative to generate a final output based on the reference frequency, the PLL further being operative to generate a single clock frequency, the final output having a frequency that is a fraction of the frequency of said single clock frequency, said PLL including a single voltage controlled oscillator (VCO) that generates said single clock frequency; and
    a plurality of dividers, a first divider of which is responsive to said single clock frequency and operative to generate multiple clock frequencies, each clock frequency, of the multiple clock frequencies, being a unique frequency relative to the other clock frequencies of the multiple clock frequencies, a fourth divider of the plurality of dividers operative to generate the final output that is substantially synchronized in at least frequency with said reference frequency,
    wherein said plurality of dividers includes the first divider responsive to said single clock frequency and operative to divide the same by a first integer value to generate a first divider output, and further includes a second divider responsive to said first divider output and operative to divide the same by a second integer value to generate a second divider output, and further includes a third divider responsive to said second divider output and operative to divide the same by a third integer value to generate a quadrature and in-phase output effectively equivalent to dividing said single clock frequency by an integer value,
    further wherein said first divider is responsive to said single clock frequency and operative to generate a clock signal quadrature output frequency and a clock signal in-phase output frequency.

2. A clock generator circuit, as recited in claim 1, wherein said first divider, said second divider and said third divider are operative to divide by 2, 8 and 2, respectively.

3. A clock generator circuit as recited in claim 1, the multiple clock frequencies are in compliance with the Ultra Wideband (UWB) system.

4. A clock generator circuit, as recited in claim 1, wherein said single clock frequency has a frequency of substantially 3,960 MHz.

5. A clock generator circuit, as recited in claim 1, further including a first single sideband (SSB) mixer coupled between the first divider and the second divider and responsive to the first divider output and the quadrature and in-phase output from the third divider, and operative to generate a phase and frequency synchronized clock frequency, the plurality of dividers having a fourth divider that is responsive to the phase and frequency synchronized clock frequency and operative to generate the final output having a frequency that is effectively equal the frequency of said single clock frequency divided by an odd integer value, said plurality of dividers further including a fourth divider responsive to the phase and frequency synchronized clock frequency from the first SSB mixer and operative to generate the final output.

6. A clock generator circuit, as recited in claim 1, wherein said single clock frequency has a a frequency offset of substantially +/−528 MHz, the second divider is operative to divide a phase and frequency synchronized clock frequency by 8, and the third divider is operative to divide by two and to generate hopping frequencies at substantially 3,432 MHz, 3,960 MHZ and 4,488 MHz for Band-Group One in accordance with the Multi-Band Orthogonal Frequency Digital Modulation (OFDM) Alliance (MBOA) Ultra Wideband (UWB) system.

7. A clock generator circuit, as recited in claim 1, further including a low-pass filter responsive to a synchronized signal, and operative to generate a filtered phase synchronized error signal.

8. A clock generator circuit, as recited in claim 7, further including a loop filter responsive to said reference frequency and operative to generate said synchronized signal.

9. A clock generator circuit, as recited in claim 1, wherein said clock generator circuit further including a second single sideband (SSB) mixer operative to generate a second unique clock frequency and a third unique clock frequency.

10. A clock generator circuit, as recited in claim 9, further including a frequency selection switch coupled to the first divider and the second SSB mixer, and operative to select from the outputs of the second SSB mixer and the first divider.

11. A clock generator circuit, as recited in claim 1, further including a first double quadrature sideband mixer operative to generate a phase and frequency synchronized clock frequency, a second double quadrature sideband mixer operative to generate a second clock frequency and a third clock frequency, wherein said first, second, and third clock frequencies are all unique.

12. A clock generator circuit, as recited in claim 1, further including a frequency selection switch coupled to a second single sideband (SSB) mixer and the first divider, and operative to generate a selected clock frequency.

13. A clock generator circuit operative to generate multiple clock frequency signals comprising:
    means for receiving a reference frequency and for generating a single clock frequency, said reference frequency being a fraction of the single clock frequency, said receiving means including means for generating said single clock frequency; and
    divider means, including a plurality of dividers, the divider means including a first divider being responsive to said single clock frequency, said plurality of dividers for generating multiple clock frequencies, each clock frequency of the multiple clock frequencies being a unique frequency relative to the other clock frequencies of the multiple clock frequencies, a fourth divider of the plurality of dividers for generating an output that is phase and frequency synchronized to said reference frequency; and
    a first single sideband (SSB) mixer coupled between the first divider and the second divider, and operative to generate a phase and frequency synchronized clock frequency, the plurality of dividers having a fourth divider that is responsive to the phase and frequency synchronized clock frequency and operative to generate the final output having a frequency that is effectively equal the frequency of said single clock frequency divided by an odd integer value, said plurality of dividers further including a fourth divider responsive to the phase and frequency synchronized clock frequency from the first SSB mixer and operative to generate the final output;

wherein the divider means includes a second divider, coupled to the first divider and a third divider, coupled to the second divider and operative to generate a third divider, further wherein the divider means is responsive to the single clock frequency and for generating a quadrature and an in-phase output effectively equivalent to dividing the single clock frequency by and integer value.

14. A clock generator circuit operative to generate multiple clock frequency signals as recited in claim 13, wherein the multiple clock frequencies are in compliance with the Ultra Wideband (UWB) system.

15. A clock generator circuit operative to generate multiple clock frequency signals as recited in claim 13, further comprising:

means for generating a phase and frequency synchronized clock frequency.

16. A clock generator circuit operative to generate multiple clock frequency signals as recited in claim 13, further comprising:

means for generating a selected clock frequency.

* * * * *